(12) United States Patent
Yook et al.

(10) Patent No.: US 11,197,372 B2
(45) Date of Patent: Dec. 7, 2021

(54) CAPACITOR HAVING THROUGH HOLE STRUCTURE AND MANUFACTURING METHOD THEREFOR

(71) Applicant: KOREA ELECTRONICS TECHNOLOGY INSTITUTE, Seongnam-si (KR)

(72) Inventors: Jong Min Yook, Seongnam-si (KR); Jun Chul Kim, Seongnam-si (KR); Dong Su Kim, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 131 days.

(21) Appl. No.: 16/661,244

(22) Filed: Oct. 23, 2019

(65) Prior Publication Data
US 2020/0137889 A1 Apr. 30, 2020

(30) Foreign Application Priority Data
Oct. 25, 2018 (KR) .......................... 10-2018-0128350

(51) Int. Cl.
*H05K 1/16* (2006.01)
*H01G 4/35* (2006.01)
*H01G 4/38* (2006.01)

(52) U.S. Cl.
CPC ............... *H05K 1/162* (2013.01); *H01G 4/35* (2013.01); *H01G 4/38* (2013.01)

(58) Field of Classification Search
CPC ..................... H05K 1/162; H05K 1/18; H05K 2201/10015; H01G 4/35; H01G 4/38; H01G 4/12; H01G 4/005; H01G 4/10; H01G 4/01; H01G 28/60
See application file for complete search history.

(56) References Cited

U.S. PATENT DOCUMENTS

| | | | |
|---|---|---|---|
| 6,606,237 B1 * | 8/2003 | Naito ..................... | H01G 4/232 361/306.3 |
| 2013/0181326 A1 * | 7/2013 | Cheng ..................... | H01L 28/91 257/534 |
| 2020/0051749 A1 * | 2/2020 | Suemasa ................ | H01G 4/232 |

FOREIGN PATENT DOCUMENTS

KR 10-2006-0062757 A 6/2006

* cited by examiner

*Primary Examiner* — Michael P McFadden
(74) *Attorney, Agent, or Firm* — Hauptman Ham, LLP

(57) ABSTRACT

An embodiment of the present invention provides a capacitor having a through hole structure and a manufacturing method therefor. The capacitor having the through hole structure includes: a baseboard having a through hole penetrating from an upper surface of the baseboard to a lower surface thereof; a first conductive layer formed on an internal surface of the through hole, and the upper surface of the baseboard, the lower surface thereof, or both the upper and lower surfaces thereof; a first dielectric layer formed on the first conductive layer; and a second conductive layer formed on the first dielectric layer.

7 Claims, 7 Drawing Sheets

CAPACITOR HAVING THROUGH HOLE STRUCTURE AND MANUFACTURING METHOD THEREFOR

CROSS REFERENCE TO RELATED APPLICATION

The present application claims priority to Korean Patent Application No. 10-2018-0128350, filed Oct. 25, 2018, the entire contents of which is incorporated herein for all purposes by this reference.

BACKGROUND OF THE INVENTION

Field of the Invention

The present invention relates generally to a capacitor having a through hole structure.

Description of the Related Art

Generally, a capacitor may be used as a structure mounted on a surface of a circuit board of an electronic device or embedded in the board, and may be combined with a resistor and an inductor in the circuit to configure various filters and may be used for signal processing. The capacitor may have improved performance by improving dielectric constant of a dielectric layer or enlarging areas of electrodes facing each other on the basis of the dielectric layer. With miniaturization of electronic devices and increase in information processing capacity, there is need for an improved capacitor.

Documents of Related Art (Patent Document 1) Korean Patent Application No. 10-2004-0101707

SUMMARY OF THE INVENTION

Accordingly, the present invention has been made keeping in mind the above problems occurring in the related art, and an embodiment of the present invention is intended to propose a capacitor having high capacitance by enlarging an area thereof.

Another objective of the embodiment of the present invention is to provide a capacitor having a through hole structure penetrating from an upper surface of a baseboard to a lower surface thereof and a manufacturing method therefor.

A further objective of the embodiment of the present invention is to provide a capacitor, in which an area of the capacitor per unit area is maximized by arranging a plurality of through holes on a baseboard, and a manufacturing method therefor.

In order to achieve the above object, according to one aspect of the present invention, there is provided a capacitor having a through hole structure. The capacitor having the through hole structure according to the embodiment of the present invention may include: a baseboard having at least one through hole penetrating from an upper surface of the baseboard to a lower surface thereof; a first conductive layer formed on an internal surface of the through hole; a first dielectric layer formed on the first conductive layer; and a second conductive layer formed on the first dielectric layer.

The first conductive layer may be further formed on the upper surface of the baseboard, the lower surface thereof, or both the upper and lower surfaces thereof.

The capacitor having the through hole structure according to the embodiment of the present invention may include: a first conductive layer that is the baseboard having at least one through hole penetrating the upper and lower surfaces of the baseboard and made of a material having electrical conductivity; a first dielectric layer formed on the internal surface of the through hole and further formed on the upper surface of the baseboard, the lower surface thereof, or both the upper and lower surfaces thereof; and the second conductive layer formed on the first dielectric layer. In other words, the baseboard is made of the material having electrical conductivity and functions as one side of the capacitor, and the baseboard is provided with the second conductive layer thereon without the first conductive layer.

In addition, a plurality of through holes may be formed in the baseboard and may be arranged in a matrix array having rows and columns by being spaced apart from each other.

The capacitor having the through hole structure according to the embodiment of the present invention may further include: an additional dielectric layer formed on the second conductive layer; and an additional conductive layer formed on the additional dielectric layer. At least one additional dielectric layer and at least one additional conductive layer may be alternately layered.

The capacitor having the through hole structure according to the embodiment of the present invention may further include: at least one connecting electrode connecting at least one additional conductive layer and the first conductive layer or the second conductive layer to each other.

The through hole may be formed in any one of circular, polygonal, and serpentine shapes.

A manufacturing method for the capacitor having the through hole structure according to the embodiment of the present invention may include: forming at least one through hole on the baseboard, the through hole penetrating from the upper surface of the baseboard to the lower surface thereof; forming the first conductive layer on the internal surface of the through hole, and on the upper surface of the baseboard, the lower surface thereof, or both the upper and lower surfaces thereof; forming the first dielectric layer on the first conductive layer; and forming the second conductive layer on the first dielectric layer.

The manufacturing method for the capacitor having the through hole structure according to the embodiment of the present invention may further include: forming the additional dielectric layer on the second conductive layer; and forming the additional conductive layer on the additional dielectric layer. The forming the additional dielectric layer and the forming the additional conductive layer may be alternately performed at least once for each.

The manufacturing method for the capacitor having the through hole structure according to the embodiment of the present invention may further include: forming at least one connecting electrode that connects the first conductive layer or the second conductive layer and the additional conductive layer to each other.

The above and other objects, features and advantages of the present invention will be more clearly understood from the following detailed description when taken in conjunction with the accompanying drawings.

All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to the embodiment of the present invention, the capacitor is formed in the through hole structure in which the though hole penetrates the upper surface of the baseboard to the lower surface thereof, so that the area of the capacitor can be enlarged.

Further, according to the embodiment of the present invention, the plurality of through holes is formed in the baseboard and the capacitor is formed on the internal surface of the through hole and the upper and lower surfaces of the baseboard. Accordingly, as the number of the through holes is increased, the area of the capacitor is increased, thereby providing the capacitor of high capacitance and the capacitor in which the through holes are arranged to increase the area of the capacitor per unit area.

Further, according to the embodiment of the present invention, at least one additional dielectric layer and at least one additional conductive layer are formed on the first conductive layer, the first dielectric layer, and the second conductive layer forming the capacitor. Accordingly, it is possible to provide the high capacitance capacitor having a multi layered structure.

Further, according to the embodiment of the present invention, the through hole is open up and down so that gas can flow therethrough. Accordingly, even when the through hole has a high height-to-diameter ratio, the conductive layer and the dielectric layer that are formed on the internal surface of the through hole can have uniform thicknesses.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
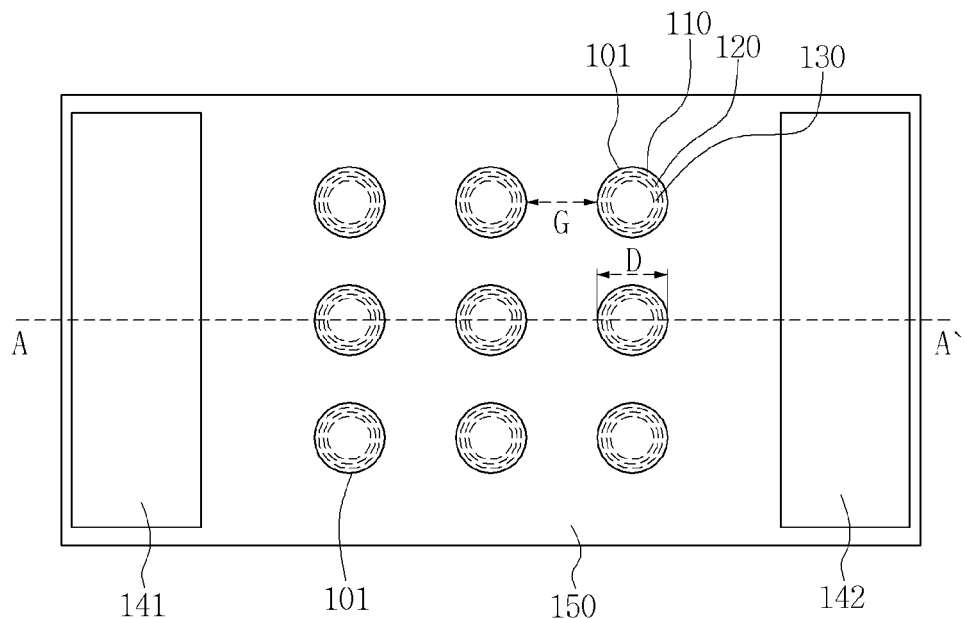
FIG. 1 is a plane view showing a capacitor having a through hole structure according to an embodiment of the present invention.

The above and other objects, features and advantages of the present invention will be more clearly understood from the following detailed description taken in conjunction with the accompanying drawings. Reference now should be made to the drawings, in which the same reference numerals are used throughout the different drawings to designate the same or similar components. Further, it will be understood that, although the terms "one side", "the other side", "first", "second", etc. may be used herein to describe various elements, these elements should not be limited by these terms. Hereinbelow, when it is determined that the detailed description of the known art related to the present invention might obscure the gist of the present invention, the detailed description thereof will be omitted.

Hereinbelow, an exemplary embodiment of the present invention will be described in detail with reference to the accompanying drawings.

Figure 2:
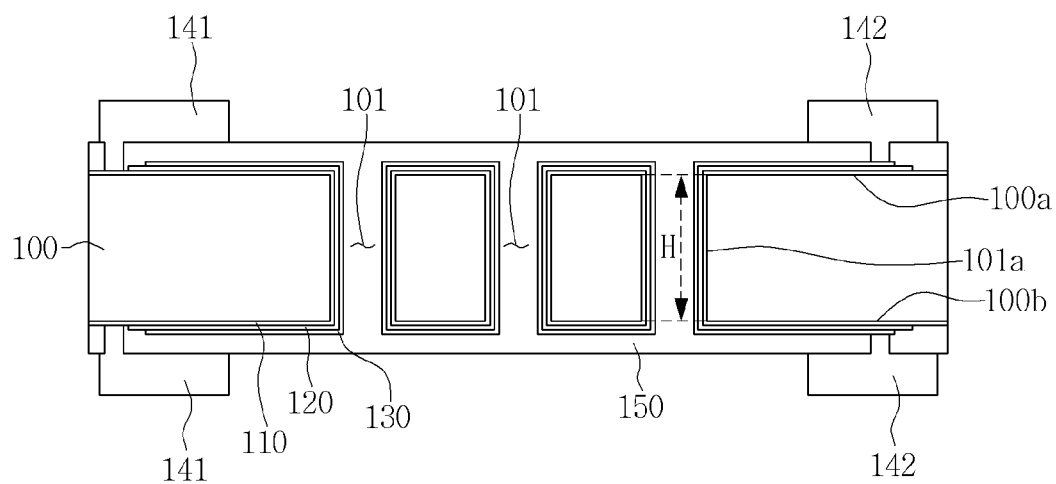
FIG. 2 is a sectional view taken along A-A' line of FIG. 1.

FIG. 1 is a plane view showing a capacitor having a through hole structure according to the embodiment of the present invention. FIG. 2 is a sectional view taken along A-A' line of FIG. 1.

As shown in FIGS. 1 and 2, according to the embodiment of the present invention, the capacitor having the through hole structure may include: a baseboard 100 having at least one through hole 101 penetrating from an upper surface 100a to a lower surface 100b; a first conductive layer 110 formed on an internal surface 101a of the through hole 101; a first dielectric layer 120 formed on the first conductive layer 110; and a second conductive layer 130 formed on the first dielectric layer 120. The first conductive layer 110 may be formed on the upper surface 100a, the lower surface 100b or both the upper surface 100a and the lower surface 100b of the baseboard 100.

The baseboard 100 may be formed of a semiconductor material such as silicon (Si), a material with low electrical conductivity such as glass, ceramic, epoxy resin, and the like or of a conductive material with high electrical conductivity such as copper (Cu), aluminum (Al), a semiconductor material doped to high levels, and the like. The baseboard 100 may function as a body supporting the capacitor.

The baseboard 100 may be provided with at least one through hole 101 thereon. The through hole 101 is formed by penetrating from the upper surface 100a of the baseboard 100 to the lower surface 100b thereof. The through hole 101 may be formed in a circular shape or a polygonal shape each having a predetermined diameter D, and may be formed by being spaced apart from an adjacent through hole 101 by a predetermined gap G. A shape and an arrangement of the through hole 101 will be described later.

The first conductive layer 110 may be formed of a metal with high electrical conductivity such as copper (Cu), aluminum (Al), silver (Ag), tungsten (W), TiN, TaN and the like or of a metallic compound including the same. The first conductive layer 110 may be formed on the internal surface 101a of the through hole 101 provided in the baseboard 100. The first conductive layer 110 is formed on the internal surface 101a of the through hole 101, and may be further formed continuously on the upper surface 100a of the baseboard 100 or the lower surface 100b thereof. In addition, the first conductive layer 110 is formed on the internal surface 101a of the through hole 101, and may be further formed continuously on the upper surface 100a of the baseboard 100 and the lower surface 100b thereof.

The first dielectric layer 120 may be formed of a dielectric material such as $SiO_2$, $SiN_x$, $Al_2O_3$, $HfO_2$, BST, STO ZrO, $Ta_2O_5$ and the like. The first dielectric layer 120 may be formed on the first conductive layer 110. That is, the first dielectric layer 120 may be formed on the first conductive layer 110 that is formed on the internal surface 101a of the through hole 101, and the upper surface 100a of the baseboard 100 or the lower surface 100b thereof. The first dielectric layer 120 may electrically isolate the first conductive layer 110 and the second conductive layer 130 formed on the first dielectric layer 120. The first dielectric layer 120 may be formed to partially expose the first conductive layer 110 so that the first conductive layer 110 is connected to an external circuit. An exposed part of the first conductive layer 110 may have a first connecting electrode 141. The first connecting electrode 141 may electrically connect the external circuit to the capacitor.

The second conductive layer 130 may be formed of the same material as the first conductive layer 110 or a different material therefrom. The second conductive layer 130 may be formed on the first dielectric layer 120. The second conductive layer 130 may be formed to have a smaller area than an area of the first dielectric layer 120 so as to be isolated from the first conductive layer 110 by the first dielectric layer 120. A facing area between the second conductive layer 130 and the first conductive layer 110 may be an area of the capacitor. The second conductive layer 130 may have a second connecting electrode 142. The second connecting electrode 142 may electrically connect the external circuit and the capacitor to each other.

The first conductive layer 110, the first dielectric layer 120, and the second conductive layer 130 that are formed on the baseboard 100 having the through hole 101 form the capacitor. A protecting layer 150 may be provided on the baseboard 100 to protect the capacitor. The protecting layer 150 is made of a dielectric material and electrically isolates the capacitor from the outside and physically protects the capacitor.

Two or more through holes 101 may be formed in the baseboard 100. When a plurality of through holes 101 are formed therein, the through holes 101 may be spaced apart from each other to be arranged as a matrix having rows and columns. For example, as shown in FIG. 1, the through holes 101 may be a matrix array of 3 rows and 3 columns.

When the plurality of through holes 101 is formed on the baseboard 100, a first conductive layer 110 formed on an internal surface 101a of one through hole 101 is formed continuously to the upper surface 100a of the baseboard 100 or the lower surface 100b thereof to be connected with a first conductive layer 110 formed on an internal surface 101a of an adjacent through hole 101 so as to be formed in a single conductive layer. It is also possible that the first dielectric layer 120 and the second conductive layer 130 are respectively formed continuously over the plurality of through holes 101. Accordingly, the capacitor may be formed in a single body, even when the plurality of through holes 101 is formed in the baseboard 100. For example, as shown in FIGS. 1 and 2, the first conductive layer 110, the first dielectric layer 120, and the second conductive layer 130 are formed continuously over a nine through holes structure to form one high capacitance capacitor.

When necessary, the plurality of through holes 101 formed in the baseboard 100 may be divided into two or more groups to form two capacitors on one baseboard 100. For example, when a baseboard 100 has four through holes 101, a first capacitor may be formed over two through holes 101 and a second capacitor may be formed over the remaining two through holes 101. In this case, a connecting terminal may be provided separately in each of the first capacitor and the second capacitor.

FIGS. 3A, 3B, 3C, and 3D are views showing relationship between a height-to-diameter ratio of the through hole and arrangement of the through hole and capacitance of the capacitor.

According to the embodiment of the present invention, the through hole 101 may be formed to have a height-to-diameter ratio (H/D) greater than a reference height-to-diameter ratio (H/D) when twice area of the through hole 101 is equal to an area of the internal surface 101a of the through hole 101. For convenience of description, a shape of the through hole 101 will be described on the basis of a circular shape.

Figure 3A:
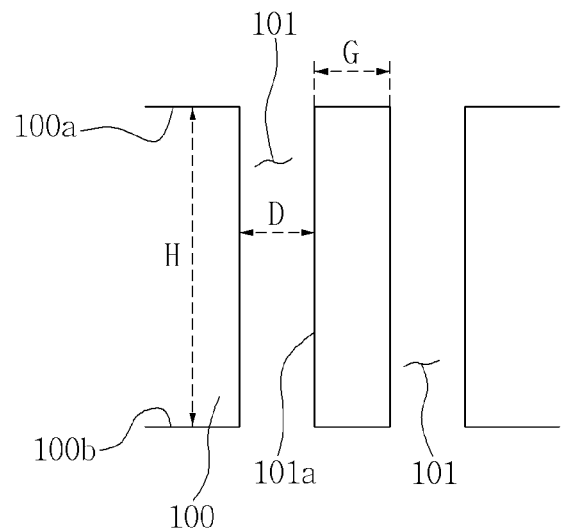
FIGS. 3A, 3B, 3C, and 3D are views showing relationship between a height-to-diameter ratio of the through hole and arrangement of the through hole and capacitance of the capacitor.

Referring to FIG. 3A, due to formation of the through hole 101, a surface area lost from the baseboard 100 is a total area ($\pi(D/2)^2 + \pi(D/2)^2$) of an upper surface 100a and a lower surface 100b which are removed by forming the through hole 101. In addition, a surface area added to the baseboard 100 is an area ($2\pi(D/2)H$) of the internal surface 101a of the through hole 101. In the embodiment of the present invention, since the capacitor may be formed on both the upper surface 100a and the lower surface 100b of the baseboard 100 which are connected to each other by the through hole 101, the twice area of the through hole 101 is the area removed by the formation of the through hole 101. Therefore, the reference height-to-diameter ratio may be defined as the height-to-diameter ratio (H/D) when the total area of the upper surface 100a and the lower surface 100b of the through hole 101 and the area of the internal surface 101a of the through hole 101 are the same. When a surface area of the baseboard 100 is not increased due to the formation of the through hole 101, an area of the capacitor is decreased due to the formation of the through hole 101. Therefore, in order to increase the surface area of the baseboard 100, a diameter (D) and a height (H) of the through hole 101 are set so that a height-to-diameter ratio (H/D) thereof is larger than the reference height-to-diameter ratio.

As the through hole 101 having the height-to-diameter ratio (H/D) higher than the reference the height-to-diameter ratio is formed in the baseboard 100, the surface area of the baseboard 100 is increased ($2\pi(D/2)h - 2\pi(D/2)^2 > 0$). Accordingly, it is possible to increase the area of the capacitor including the first conductive layer 110, the first dielectric layer 120, and the second conductive layer 130 that are formed on the baseboard 100 in which the through hole 101 is formed. Even when the baseboard 100 has only one through hole 101, the area of the capacitor formed therein is increased in comparison with a structure without the through hole 101 so that capacitance of the capacitor may be increased.

In the case of a capacitor formed in a baseboard having a groove or a trench structure rather than the through hole structure, it is difficult to form a conductive layer and a dielectric layer on a blocked portion of a groove or a trench as a height (H) to diameter (D) ratio is increased. However, according to the embodiment of the present invention, since the capacitor having the through hole structure is not blocked on one side, it is easy to form the conductive layers 110 and 130 the dielectric layer 120 by vapor deposition and the like. Therefore, the through hole 101 according to the embodiment of the present invention may have a ratio of the height (H) of the through hole 101 to the diameter (D) of the through hole 101 of 5:1 to 10:1 or more, and may be formed by a high height-to-diameter ratio (H/D) of 20:1 or more.

Meanwhile, in order to obtain the high height-to-diameter ratio (H/D), the diameter (D) of the through hole 101 may be reduced or the height (h) of the through hole 101 may be increased. Since the first conductive layer 110, the first dielectric layer 120, and the second conductive layer 130 should be formed on the internal surface of the through hole 101, there is a limit in forming a diameter (D) of the through hole 101 to be small. Accordingly, in order to obtain the high height-to-diameter ratio (H/D), setting the height of the through hole 101 to be high may be an effective way to increase the area of the capacitor. The height (H) of the through hole 101 may be determined on the basis of a thickness of the baseboard 100 and the thickness of the baseboard 100 and the height (H) of the through hole 101 may be relative to each other.

Figure 3B:
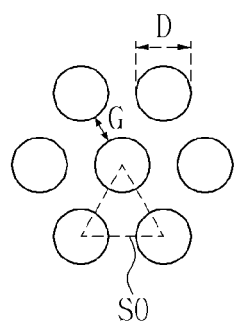
Figure 3C:
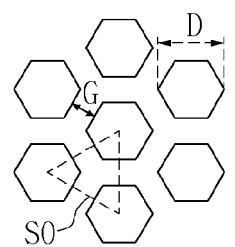

When the plurality of through holes 101 are formed in the baseboard 100, the area of the capacitor having the through hole structure may vary depending on a gap (G) between the through holes and arrangement of the through holes 101. According to the embodiment of the present invention, the through hole of the capacitor having the through hole structure may be formed in a square matrix array having rows and columns as shown in FIG. 1. Otherwise, as shown in FIGS. 3B and 3C, the through hole of the capacitor having the through hole structure may be formed in an arrangement in which the plurality of through holes are equally spaced apart from each other, a shape of each of through holes is formed in the circular shape or the hexagonal shape, and six through holes are arranged adjacent to one through hole.

The area of the capacitor due to the formation of the through hole may be determined by the following equation.

$$C_{3d} = \left(a \times \frac{H}{D} \times C_{2d}\right) \times AF \quad \text{[Equation 1]}$$

($C_{3d}$=area of capacitor due to formation of through hole, a=coefficient according to shape of through hole, H=height of through hole, D=diameter of through hole, $C_{2d}$=plane area of through hole, AF=area factor)

According to Equation 1, the area (C3d) of the capacitor formed due to the formation of the through hole 101 is relative to the height-to-diameter ratio (H/D) and the area factor (AF). The area factor (AF) is an area ratio occupied by the through hole 101 per unit area (S0). The coefficient (a) according to the shape of the through hole may be derived from an area of the internal surface 101a of the through hole 101 when the area of the through hole 101 is multiplied by the height-to-diameter ratio (H/D) and by the coefficient (a). Since the area of the through hole 101 and the area of the internal surface 101a vary depending on the shape of the through hole, it is also possible that the coefficient (a) varies depending on the shape of the through hole 101.

The area factor (AF) may be calculated by deriving the area of the through hole 101 by using the diameter (D) of the through hole 101 and the gap (G) of the through holes 101 and dividing the area by the unit area. When the shape and diameter (D) of the through hole 101 and the gap between the through holes 101 are the same, the area factor (AF) may vary depending on a plane arrangement of the through holes 101. The area factor (AF) is larger when six through holes are arranged to surround one through hole, as shown in FIGS. 3B and 3C, rather than when the through holes 101 are formed in the square matrix array, as shown in FIG. 1. When the arrangement is the same as FIGS. 3B and 3C, an area factor (AF) when the shape of the through hole has the hexagonal shape is larger than an area thereof when the through hole has the circular shape.

Figure 3D:
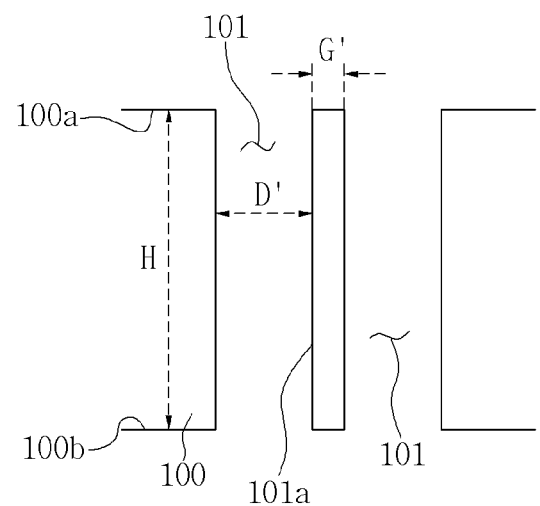

When the area factor (AF) is increased by reducing a gap (G') between the through holes 101 in order to increase the area (C3d) of the capacitor due to the formation of the through hole 101, as shown in FIG. 3D, the area factor (AF) is increased but a diameter (D') of the through hole 101 is increased so that the height-to-diameter ratio is lowered. Therefore, in order to maximize the area of the capacitor at the same area, it is necessary to increase both the height-to-diameter ratio (H/D) and the area factor (AF). That is, it is preferable to simultaneously increase the height-to-diameter ratio (H/D) and minimize the gap (G') between the through holes 101.

Figure 4:
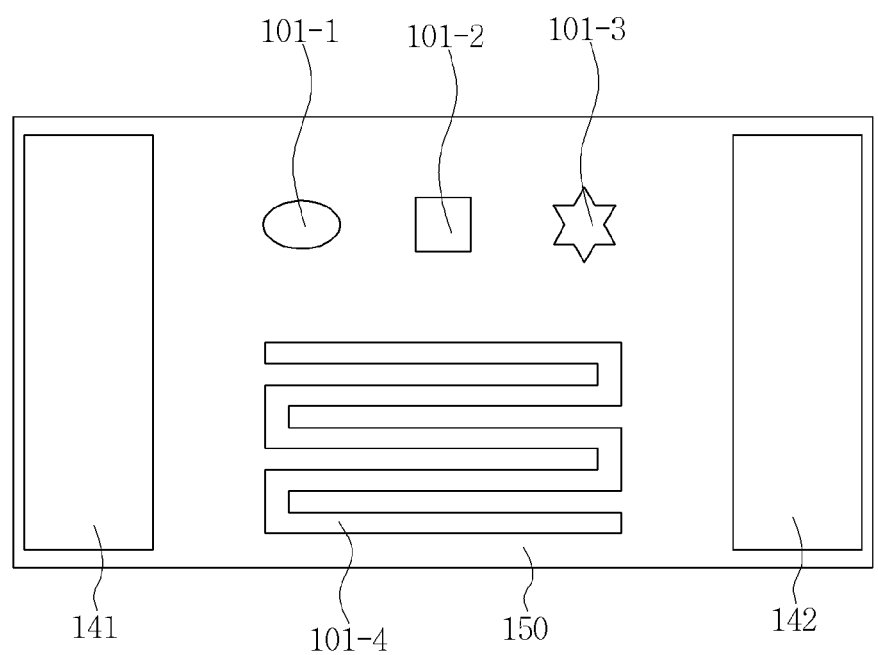
FIG. 4 is a plane view showing various shapes of the through hole according to the embodiment of the present invention.

FIG. 4 is a plane view showing various shapes of the through hole according to the embodiment of the present invention.

As shown in FIG. 4, the through hole 101 may have various shapes. For example, the through hole 101 may be formed in the circular shape such as a circle 101 (referring to FIG. 1) or an ellipse 101-1 (referring to FIG. 4), or the polygonal shape such as a square 101-2 or a star shape 101-3. In addition, the through hole 101 may be formed in a thin long serpentine shape 101-4, and may be formed in a thin long spiral shape.

The through hole 101 may have the same shape as the upper surface 100a and the lower surface 100b and may have a different shape from the upper surface 100a and the lower surface 100b. Areas of the upper surface 100a and the lower surface 100b of the through hole 101 may be equally formed to each other and may be differently formed from each other. The through hole 101 may be formed vertically to the upper surface 100a of the baseboard 100 and may be formed along a direction inclined by a predetermined angle with respect to the upper surface 100a of the baseboard 100. The shape of the through hole 101 is not limited to the specification, and it is clear that the use of the through hole 101 in various structures to increase the height-to-diameter ratio of the through hole 101 is included in the embodiment of the present invention.

Compared to the conventional planar capacitor, the capacitor having the through hole structure according to the embodiment of the present invention has an advantage of increasing capacitance of the capacitor as a surface area of the capacitor is increased due to the formation of the through hole 101. In addition, in the capacitor having the through hole structure according to the embodiment of the present invention, the plurality of through holes 101 forms one capacitor, thus there is an advantage that the areas of the upper surface 100a and the lower surface 100b of the baseboard 100, as well as the area of the internal surface 101a of the through hole 101, are also used as the area of the capacitor.

Figure 5:
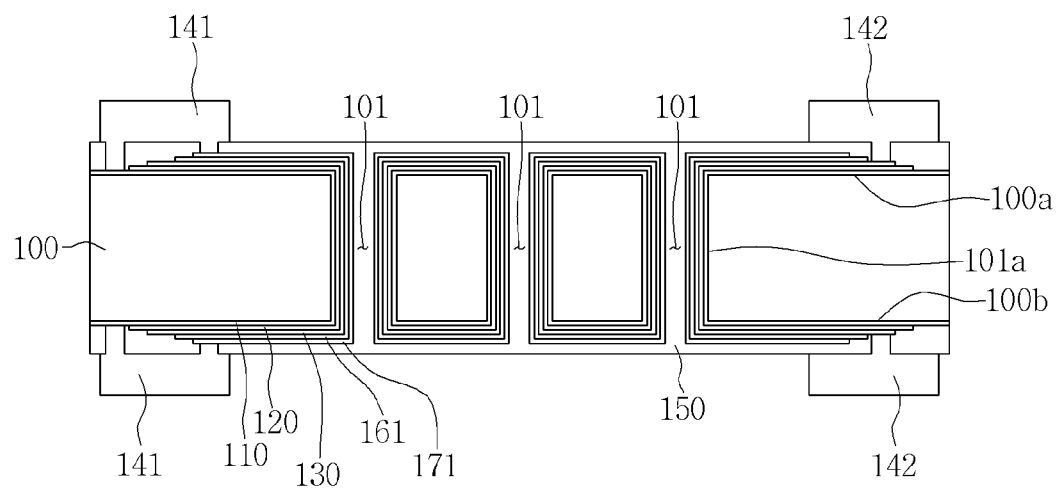
FIG. 5 is a sectional view showing the capacitor having the through hole structure further including an additional dielectric layer and an additional conductive layer according to the embodiment of the present invention.

FIG. 5 is a sectional view showing the capacitor having the through hole structure further including an additional dielectric layer and an additional conductive layer according to the embodiment of the present invention.

The capacitor having the through hole structure according to the embodiment of the present invention may further have an additional dielectric layer formed on the second conductive layer 130 and an additional conductive layer formed on the additional dielectric layer, and at least one additional dielectric layer and at least one additional conductive layer are alternately layered. In addition, the capacitor having the through hole structure according to the embodiment of the present invention may further have at least one connecting electrode that connects at least one additional conductive layer to the first conductive layer 110 or the second conductive layer 130.

For example, as shown in FIG. 5, a first additional dielectric layer 161 is formed on the second conductive layer 130, and a first additional conductive layer 171 is formed on the first additional dielectric layer 161. The first connecting electrode 141 electrically connects the first additional conductive layer 171 and the first conductive layer 110 to each other. The second connecting electrode 142 is formed on the second conductive layer 130 to form a multi layered capacitor with a structure in which the second conductive layer 130 is provided between the first conductive layer 110 and the first additional conductive layer 171.

For example, a second additional dielectric layer (not shown) may be formed on the first additional conductive layer 171 and a second additional conductive layer (not shown) may be formed on the second additional dielectric layer. Thus, a multi layered capacitor with a structure in which the second connecting electrode 142 connects the second conductive layer 130 and the second additional conductive layer to each other may be formed.

In the capacitor having the through hole structure according to the embodiment of the present invention, the additional dielectric layer and the additional conductive layer are formed in the capacitor including the first conductive layer 110, the first dielectric layer 120, and the second conductive layer 130, and the connecting electrode connects the conductive layers together, so that the high capacitance capacitor with increased area may be provided.

Figure 6:
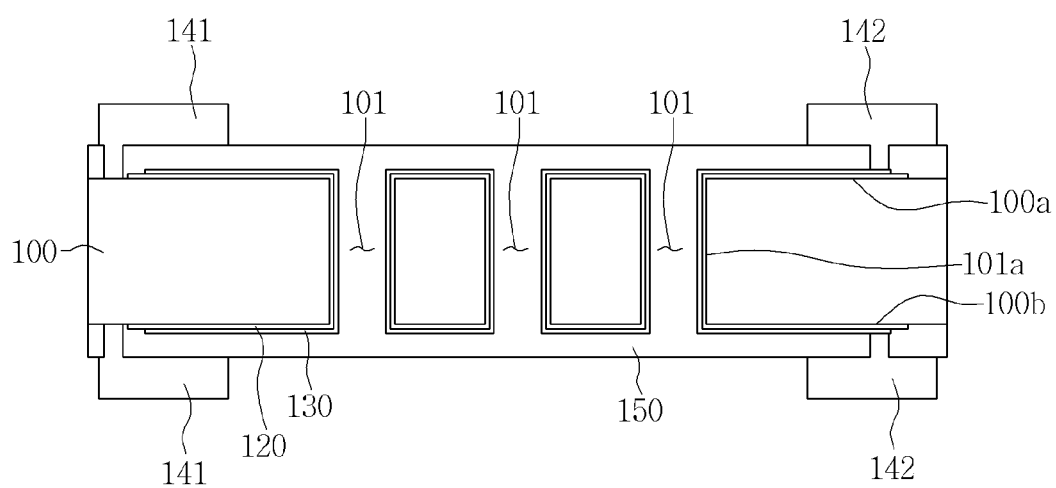
FIG. 6 is a sectional view showing the capacitor having the through hole structure including a baseboard having electrical conductivity according to the embodiment of the present invention.

FIG. 6 is a sectional view showing the capacitor having the through hole structure including the baseboard 100 having electrical conductivity according to the embodiment of the present invention.

As shown in FIG. 6, according to the embodiment of the present invention, the capacitor having the through hole structure may include: a first conductive layer that is the baseboard 100, which has at least one through hole 101 penetrating from the upper surface 100*a* to the lower surface 100*b* and formed of the material having electrical conductivity; the first dielectric layer 120 formed on the internal surface 101*a* of the through hole 101, and further formed on the upper surface 100*a*, the lower surface 100*b* or both the upper surface 100*a* and the lower surface 100*b* of the baseboard 100; and the second conductive layer 130 formed on the first dielectric layer 120. That is, the baseboard 100 is formed of the material having electrical conductivity and may function as one side surface of the capacitor, and the baseboard 100 may be provided with the first dielectric layer 120 without the first conductive layer 110.

The baseboard 100 is made of a metal such as copper (Cu), aluminum (Al), an alloy containing a metal, a semiconductor material doped to high levels to have electrical conductivity, or the like, and the baseboard 100 itself may function as one side surface of the capacitor. Therefore, in this case, since the baseboard 100 performs function of the first conductive layer (referring to 110 in FIG. 2), the baseboard 100 may be referred to as the first conductive layer (referring to 110 in FIG. 2). In other words, the capacitor may be configured of the first conductive layer (that is, the baseboard 100), the first dielectric layer 120, and the second conductive layer 130. When the baseboard 100 is made of an electrically conductive material, the first conductive layer (referring to 110 in FIG. 2) may be omitted, thereby simplifying the structure and manufacturing steps thereof.

The first dielectric layer 120 may be formed on the baseboard 100 in which at least one through hole 101 is formed. The first dielectric layer 120 may be formed on the internal surface 101*a* of the through hole 101, and the upper surface 100*a*, the lower surface 100*b*, or both the upper surface 100*a* and the lower surface 100*b* of the baseboard 100. The second conductive layer 130 may be formed on the first dielectric layer 120.

At least one additional dielectric layer and at least one additional conductive layer are alternately formed on the second conductive layer 130. The connecting electrode may connect the first conductive layer (that is, the baseboard 100) or the second conductive layer 130 to the additional conductive layer to form the capacitor of the multi layered structure. Detailed descriptions of the through hole structure and the multi layered structure and advantages thereof are the same as the above description and thus will be omitted.

FIGS. 7 to 10 are views showing each step of a manufacturing method for the capacitor having the through hole structure according to the embodiment of the present invention.

According to the embodiment of the present invention, a manufacturing method for the capacitor having the through hole structure may include: forming at least one through hole 101 on the baseboard 100, the through hole 101 penetrating from the upper surface 100*a* to the lower surface 100*b*; forming the first conductive layer 110 on the internal surface 101*a* of the through hole 101, and the upper surface 100*a*, the lower surface 100*b*, or both the upper surface 100*a* and the lower surface 100*b* of the baseboard 100; forming the first dielectric layer 120 on the first conductive layer 110; and forming the second conductive layer 130 on the first dielectric layer 120. In addition, according to the embodiment of the present invention, the manufacturing method for the capacitor having the through hole structure may further include: forming the protecting layer 150 on the second conductive layer 130; and forming the first connecting electrode 141 connected with the first conductive layer 110 and the second connecting electrode 142 connected with the second conductive layer 130.

Figure 7:
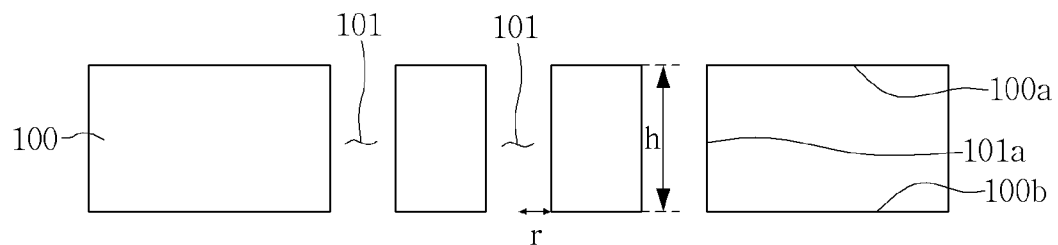
FIGS. 7 to 10 are views showing each step of a manufacturing method for the capacitor having the through hole structure according to the embodiment of the present invention.

First, the baseboard 100 is prepared. As shown in FIG. 7, in the through hole forming step, at least one through hole 101 is formed in the baseboard 100. The through hole 101 is formed to penetrate from the upper surface 100*a* of the baseboard 100 to the lower surface 100*b* of the baseboard 100. When the plurality of through holes 101 is formed, the through holes 101 may be formed in the matrix array shape including rows and columns The through holes 101 may be formed using known methods such as dry or wet etching, laser etching, drilling, and the like.

Figure 8:
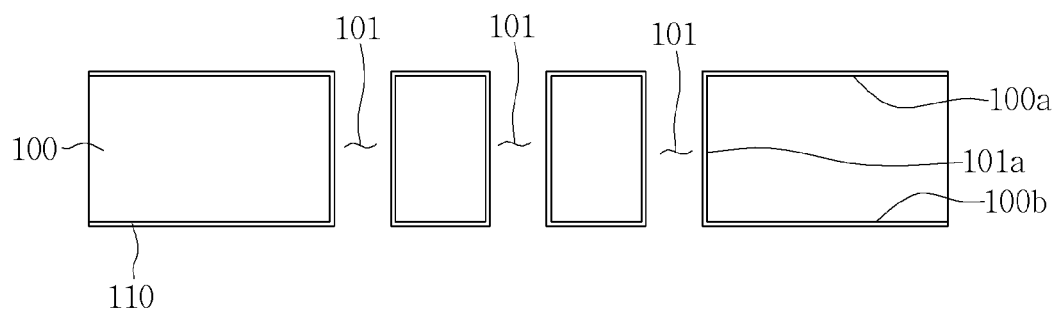

Next, as shown in FIG. 8, the first conductive layer 110 is formed on the baseboard 100 in which the through hole 101 is formed. The first conductive layer 110 may be formed using known methods such as chemical vapor deposition (CVD), electroplating and the like. When the first conductive layer 110 is formed using the method such as CVD, through the through hole 101 of the baseboard 100, gas may flow from the upper surface 100*a* of the baseboard 100 to the lower surface 100*b* thereof or from the lower surface 100*b* to the upper surface 100*a*. Therefore, a thickness of the first conductive layer 110 formed on the upper surface 100*a* and the lower surface 100*b* of the baseboard 100 and the internal surface 101*a* of the through hole 101 may be formed uniformly. At this point, the first conductive layer 110 may be simultaneously formed on the upper surface 100a and the lower surface 100b of the baseboard 100 and the internal surface 101a of the through hole 101.

Conventionally, attempts have been made to increase the area of the capacitor by forming a groove that is blocked on one side in the baseboard 100. However, when the conductive layer is formed using the method such as CVD, there is a problem in that flow of gas is not uniform in lower and upper portions of the groove, so that a thickness of the conductive layer becomes uneven or the groove is blocked. In the manufacturing method for the capacitor having the through hole structure according to the embodiment of the present invention, gas flow freely through the through hole 101 so that there is an advantage in that a thickness of the conductive layer or the dielectric layer may be formed uniformly.

The baseboard 100 may be made of the metal material and the first dielectric layer 120 may be formed directly on the baseboard 100 without forming the first conductive layer 110. In this case, since the first conductive layer forming step may be omitted, there is an advantage of shortening the manufacturing process.

Figure 9:
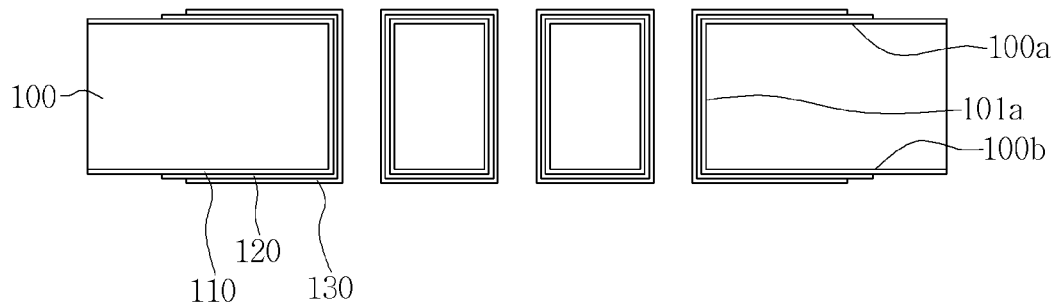

Next, as shown in FIG. 9, the first dielectric layer 120 is formed on the first conductive layer 110. The first dielectric layer 120 may be formed to cover the first conductive layer 110. The first dielectric layer 120 may be formed to expose the portion where the first connecting electrode 141 and the first conductive layer 110 are connected to each other. A mask may be formed on a position where the first connecting electrode 141 is connected to the first conductive layer 110 and then be removed after the first dielectric layer 120 is formed, or the first dielectric layer 120 may be formed on the first conductive layer 110 and then a part of the first dielectric layer 120 in the portion where the first connecting electrode 141 is formed may be removed.

Next, as shown in FIG. 9, the second conductive layer 130 is formed on the first dielectric layer 120. The second conductive layer 130 is formed on the first dielectric layer 120 so as to be electrically isolated from the first conductive layer 110. The second conductive layer 130 may be formed using the known methods such as CVD like the first conductive layer 110.

Figure 10:
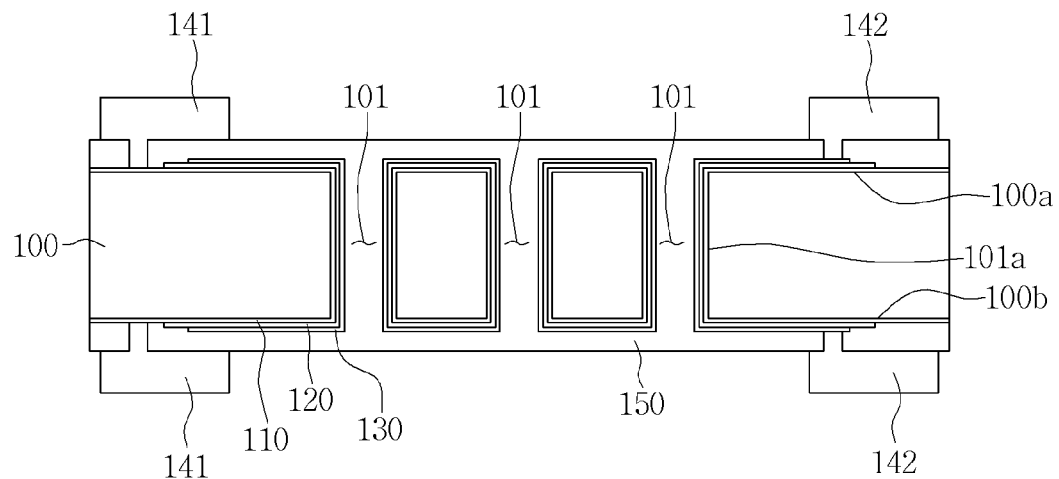

Next, as shown in FIG. 10, the protecting layer 150 is formed on the second conductive layer 130. The protecting layer 150 may be formed using the dielectric material. Next the protecting layer 150 is partially removed to expose portions of the first conductive layer 110 and the second conductive layer 130, and the first connecting electrode 141 connected with the first conductive layer 110 is formed and the second connecting electrode 142 connected with the second conductive layer 130 is formed thereon. The first connecting electrode 141 and the second connecting electrode 142 may be formed on both the upper surface 100a of the baseboard 100 and the lower surface 100b thereof, or may be formed on the upper surface 100a of the baseboard 100 or the lower surface 100b thereof one by one.

Next, when a plurality of capacitors on one baseboard 100, the manufacturing method may further include: dividing the baseboard 100, that is, after all steps of forming the through hole 101, forming the first conductive layer 110, forming the first dielectric layer 120, forming the second conductive layer 130, forming the protecting layer 150, and forming the connecting electrode are performed, the baseboard 100 is cut and divided on the basis of a boundary of the capacitors.

In the manufacturing method for the capacitor having the through hole structure according to the embodiment of the present invention, since the upper and lower surfaces 100a and 100b are connected to each other through the through hole 101, the conductive layer and the dielectric layer are formed uniformly so that the high yield of the product and high capacitance capacitor can be provided.

Figure 11:
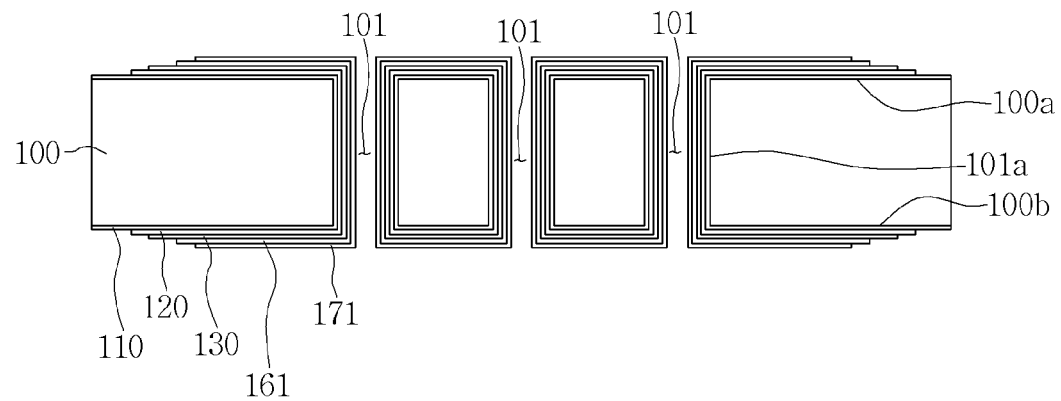
FIGS. 11 and 12 are views showing some steps of the manufacturing method for the capacitor having the through hole structure according to the embodiment of the present invention, the method further including forming the additional dielectric layer and additional conductive layer.
Figure 12:
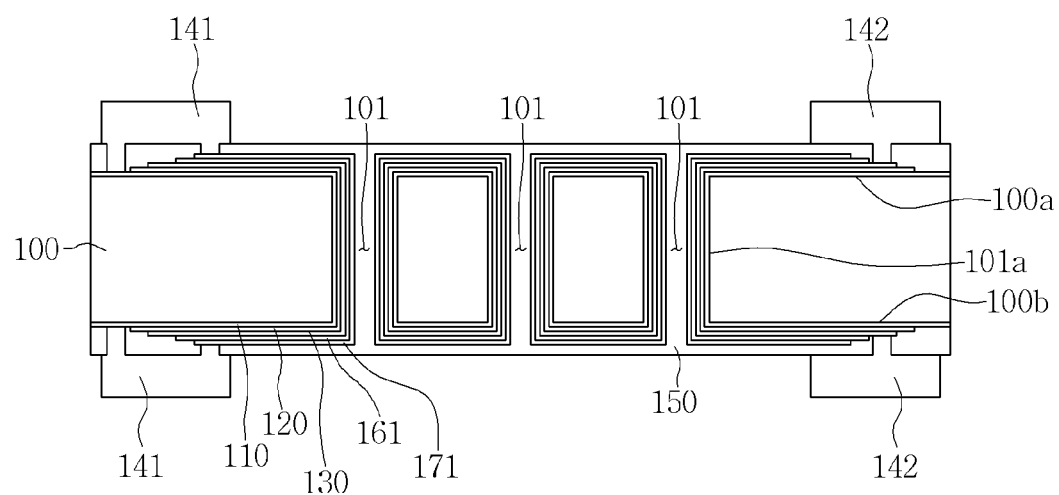

FIGS. 11 and 12 are views showing some steps of the manufacturing method for the capacitor having the through hole structure according to the embodiment of the present invention, the method further including the step of forming the additional dielectric layer and the additional conductive layer.

The manufacturing method for the capacitor having the through hole structure according to the embodiment of the present invention may further include: forming the additional dielectric layer on the second conductive layer 130; and forming the additional conductive layer on the additional dielectric layer. The steps of forming the additional dielectric layer and the second conductive layer may be alternately performed at least once for each.

In the state where the baseboard 100 is provided with the first conductive layer 110, the first dielectric layer 120, and the second conductive layer 130 as shown in FIG. 9, steps of forming the first additional dielectric layer 161 and forming the first additional conductive layer 171 may be performed, as shown in FIG. 10. The first additional dielectric layer 161 is formed on the second conductive layer 130 to electrically isolate the second conductive layer 130 and the first additional conductive layer 171. The first additional conductive layer 171 is formed on the first additional dielectric layer 161. When necessary, the second additional dielectric layer (now shown) and the second additional conductive layer (now shown) may be sequentially formed.

Next, as shown in FIG. 11, the manufacturing method for the capacitor having the through hole structure according to the embodiment of the present invention may further include: forming at least one connecting electrode connecting the first conductive layer 110 or the second conductive layer 130 to the additional conductive layer. Before formation of the connecting electrode, the step of forming the protecting layer 150 may be performed, the protecting layer 150 being formed to cover the first conductive layer 110, the first dielectric layer 120, the second conductive layer 130, the first additional dielectric layer 161, and the first additional conductive layer 171. Next, the protecting layer 150 is partially removed to expose the portions of the first conductive layer 110, the second conductive layer 130, and the first additional conductive layer 171. Next, the first connecting electrode 141 connecting the first conductive layer 110 and the first additional conductive layer 171 to each other is formed, the second connecting electrode 142 connected with the second conductive layer 130 is formed. When the second additional dielectric layer and the second additional conductive layer are formed, the second connecting electrode 142 may be formed to connect the second conductive layer 130 and the second additional conductive layer to each other.

Although the present invention has been described in detail with reference to the specific embodiment for illustrative purposes and is not limited thereto. Those skilled in the art will appreciate that various modifications, additions and substitutions are possible, without departing from the scope and spirit of the present invention.

Simple modifications and alterations of the present invention are all included within the scope of the present invention, and the specific scope of protection will be clear from the accompanying claims.

What is claimed is:

1. A capacitor having a through hole structure, the capacitor comprising:
   a first conductive layer that is a baseboard, which has at least one through hole penetrating from an upper surface of the first conductive layer to the lower surface of the first conductive layer, wherein the first conductive layer is formed of a material having electrical conductivity;
   a first dielectric layer formed on the internal surface of the through hole, and further formed on the upper surface and the lower surface of the baseboard; and
   a second conductive layer formed on the first dielectric layer,
   wherein, a diameter (D) and a height (H) of the through hole are set so that a height-to-diameter ratio (H/D) of the through hole is larger than a reference H/D, and
   wherein the reference H/D is the H/D of the through hole in which a total area of the upper surface and the lower surface of the through hole and an area of the internal surface of the through hole are the same.

2. The capacitor of claim 1, wherein a plurality of through holes is formed by being spaced apart from each other at a regular gap, each of the through holes is formed in a circular shape or a hexagonal shape, and six through holes are arranged adjacent to one through hole.

3. The capacitor of claim 1, further comprising:
   an additional dielectric layer formed on the second conductive layer; and
   an additional conductive layer formed on the additional dielectric layer,
   wherein at least one additional dielectric layer and at least one additional conductive layer are alternately layered.

4. The capacitor of claim 3, further comprising:
   at least one connecting electrode connecting the at least one additional conductive layer and the first conductive layer or the second conductive layer to each other.

5. A manufacturing method for a capacitor having a through hole structure, the manufacturing method comprising:
   forming at least one through hole on a baseboard that is a first conductive layer, the baseboard is formed of the material having electrical conductivity, the through hole penetrating from an upper surface of the baseboard to a lower surface of the baseboard;
   forming a first dielectric layer on an internal surface of the through hole, the upper surface of the baseboard, and the lower surface of the baseboard; and
   forming a second conductive layer on the first dielectric layer,
   wherein, a diameter (D) and a height (H) of the through hole are set so that a height-to-diameter ratio (H/D) of the through hole is larger than a reference H/D, and
   wherein the reference H/D is the H/D of the through hole in which a total area of the upper surface and the lower surface of the through hole and an area of the internal surface of the through hole are the same.

6. The manufacturing method of claim 5, further comprising:
   forming an additional dielectric layer on the second conductive layer; and
   forming an additional conductive layer on the additional dielectric layer,
   wherein the forming the additional dielectric layer and the forming the additional conductive layer are alternately performed at least once for each.

7. The manufacturing method of claim 6, further comprising:
   forming at least one connecting electrode that connects the first conductive layer or the second conductive layer and the additional conductive layer to each other.

* * * * *